(12) United States Patent
Norita et al.

(10) Patent No.: US 11,275,004 B2
(45) Date of Patent: *Mar. 15, 2022

(54) STRENGTH TEST METHOD FOR METAL ROOFING MATERIAL, STRENGTH TEST EQUIPMENT, AND VIRTUAL STRENGTH TEST PROGRAM

(71) Applicant: Nisshin Steel Co. Ltd., Tokyo (JP)

(72) Inventors: Katsunari Norita, Tokyo (JP); Keita Noguchi, Tokyo (JP); Norimasa Miura, Tokyo (JP)

(73) Assignee: Nisshin Steel Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/085,196

(22) PCT Filed: Mar. 6, 2017

(86) PCT No.: PCT/JP2017/008785
§ 371 (c)(1),
(2) Date: Sep. 14, 2018

(87) PCT Pub. No.: WO2017/159428
PCT Pub. Date: Sep. 21, 2017

(65) Prior Publication Data
US 2019/0087527 A1    Mar. 21, 2019

(30) Foreign Application Priority Data
Mar. 15, 2016 (JP) .............................. JP2016-050805

(51) Int. Cl.
*G01N 3/20* (2006.01)
*G01N 3/08* (2006.01)
(Continued)

(52) U.S. Cl.
CPC ................. *G01N 3/20* (2013.01); *E04D 1/18* (2013.01); *E04D 1/28* (2013.01); *G01N 3/08* (2013.01);
(Continued)

(58) Field of Classification Search
CPC .. G06F 17/5086; G06F 17/5009; G06F 30/17; G06F 30/20; E04D 1/28;
(Continued)

(56) References Cited

U.S. PATENT DOCUMENTS 4,926,694 A * 5/1990 Crews, Jr. ................ G01N 3/20
73/794
5,275,057 A * 1/1994 Alexander ................ G01B 5/30
33/790
(Continued)

FOREIGN PATENT DOCUMENTS

CN    203519434 U    4/2014
JP    57-059346      4/1982
(Continued)

OTHER PUBLICATIONS

Maria Ines Avo de Almeida, Structural behaviour of composite sandwich panels for applications in the construction industry, Institute Superior Tecnico, Oct. 2009, pp. 1-13.*
(Continued)

*Primary Examiner* — Marrit Eyassu
(74) *Attorney, Agent, or Firm* — Cook Alex Ltd.

(57) ABSTRACT

The present invention provides a method for testing strength of a metal roofing material, the metal roofing material comprising: a front substrate made of a metal sheet; a back substrate arranged on the back side of the front substrate; and a core material filled between the front substrate and the back substrate, the method comprising the steps of: tightening the metal roofing material 1 to a base 50; and applying
(Continued)

a load 52L for uplifting an end portion 1E of the metal roofing material 1 tightened to the base 50 to the end portion 1E and measuring an uplift amount of the end portion 1E corresponding to the load 52L.

4 Claims, 10 Drawing Sheets

(51) Int. Cl.
*E04D 1/18* (2006.01)
*E04D 1/28* (2006.01)
*G06F 30/17* (2020.01)
*G06F 30/20* (2020.01)

(52) U.S. Cl.
CPC .............. *G06F 30/17* (2020.01); *G06F 30/20* (2020.01); *G01N 2203/0017* (2013.01); *G01N 2203/0091* (2013.01)

(58) Field of Classification Search
CPC ... E04D 1/18; G01N 3/20; G01N 3/08; G01N 3/14; G01N 2203/0033
USPC .......................................................... 73/760
See application file for complete search history.

(56) References Cited

U.S. PATENT DOCUMENTS

| | | | | |
|---|---|---|---|---|
| 6,205,863 | B1* | 3/2001 | Ishii | G01N 3/10 73/805 |
| 10,078,046 | B2* | 9/2018 | Padhye | G01N 3/08 |
| 2002/0144556 | A1* | 10/2002 | Hasegawa | G01N 3/08 73/831 |
| 2003/0054740 | A1* | 3/2003 | Mansky | G01N 3/02 451/57 |
| 2008/0053239 | A1* | 3/2008 | Tunney | G01M 5/005 73/857 |
| 2008/0096293 | A1* | 4/2008 | Suhir | G01N 3/08 438/14 |
| 2008/0141782 | A1* | 6/2008 | Kim | G01N 3/42 73/823 |
| 2008/0202254 | A1* | 8/2008 | Deng | G01N 3/24 73/827 |
| 2012/0103081 | A1* | 5/2012 | Hoshino | G01N 19/04 73/150 A |
| 2013/0247682 | A1* | 9/2013 | Oh | B81C 99/005 73/826 |
| 2015/0276579 | A1* | 10/2015 | Jeong | G01N 19/04 73/150 A |
| 2015/0292999 | A1* | 10/2015 | Futatsuka | G01N 3/42 73/81 |
| 2015/0362414 | A1* | 12/2015 | Stoeckel | G01N 3/08 404/128 |
| 2018/0080228 | A1 | 3/2018 | Izumi et al. | |
| 2019/0119917 | A1* | 4/2019 | Okubo | E04D 1/18 |

FOREIGN PATENT DOCUMENTS

| | | |
|---|---|---|
| JP | 63-020044 | 2/1988 |
| JP | S64-053946 U | 4/1989 |
| JP | 05-005351 | 11/1993 |
| JP | 2000-146752 | 5/2000 |
| JP | 2000-258294 | 9/2000 |
| JP | 2004-138401 | 5/2004 |
| JP | 2004-138450 | 5/2004 |
| JP | 2005-344416 | 12/2005 |
| JP | 2008-057172 | 3/2008 |
| JP | 2011-226231 | 11/2011 |
| JP | 2012-098141 | 5/2012 |
| JP | 2012098141 A * | 5/2012 |
| JP | 5864015 | 1/2016 |
| JP | 6209635 | 9/2017 |

OTHER PUBLICATIONS

Instron, Flatwise Tensile Strength Fixtures, Catalog No. 2505-013/014/015 (Year: 2003).*
Notification of Reason for Refusal, counterpart Korean Appl. No. 10-2018-7029727 with English translation (dated Apr. 15, 2019) (9 pages).
Avo De Almeida, Structural behavior of composite sandwich panels for applications in the construction industry, M.Sc. Thesis Extended Abstract, Institute Superior Tecnico, Universidade Tecnica de Lisboa, (Oct. 1, 2009) (16 pages).
Extended European Search Report and Written Opinion, counterpart EP Appl. No. 17766430, dated Feb. 15, 2019 (8 pages).
English translation of the International Preliminary Report on Patentability, counterpart International Appl. No. PCT/JP2017/008785, dated Sep. 27, 2018 (7 pages).
Notification of Reason for Refusal, counterpart Korean App. No. 10-2018-7029727, with English translation (dated Dec. 21, 2018) (8 pages).
International Search Report and Written Opinion, counterpart International Appl. No. PCT/JP2017/008785, with partial English translation (dated May 9, 2017) (9 pages).
Notification of Reasons for Refusal, counterpart Japanese App. No. 2016-050805, with English translation (dated Jul. 10, 2017) (6 pages).
Decision to Grant a Patent, counterpart Japanese App. No. 2016-050805, with English translation (dated Aug. 10, 2017) (6 pages).

* cited by examiner

[FIG. 1]
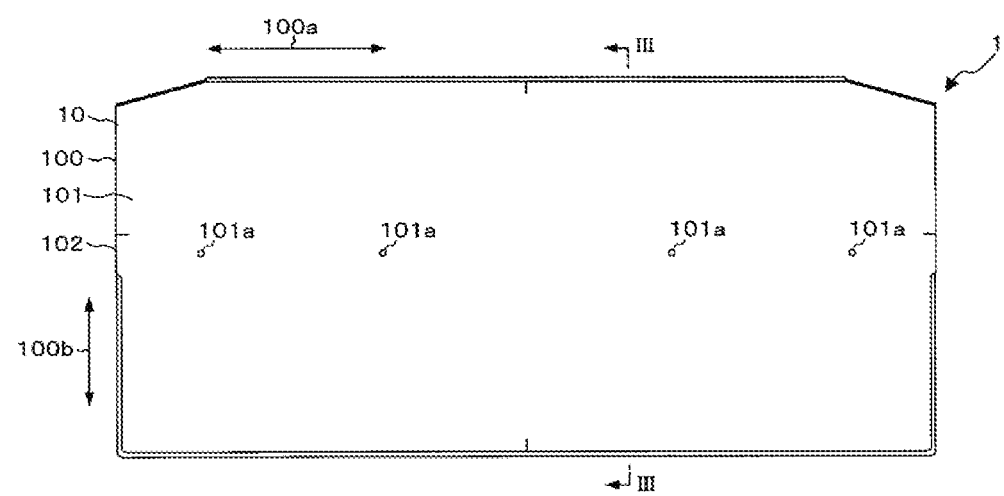

[FIG. 2]
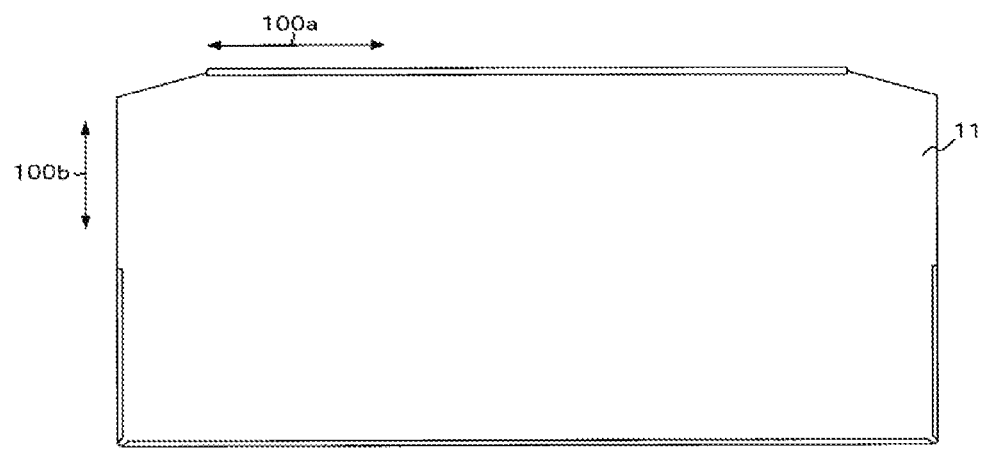

[FIG. 3]
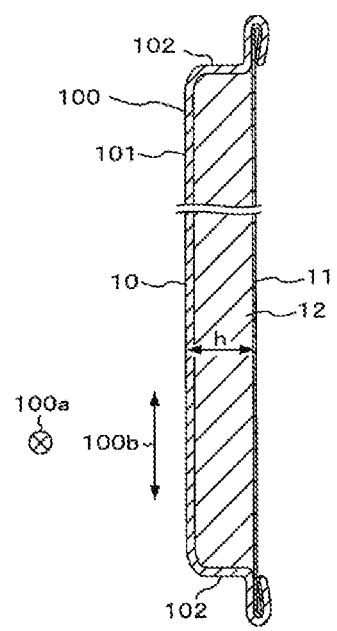

[FIG. 4]
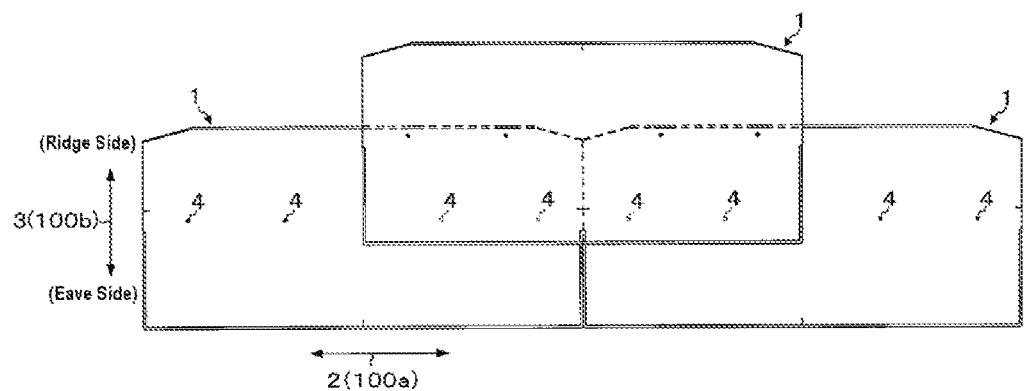

[FIG. 5]
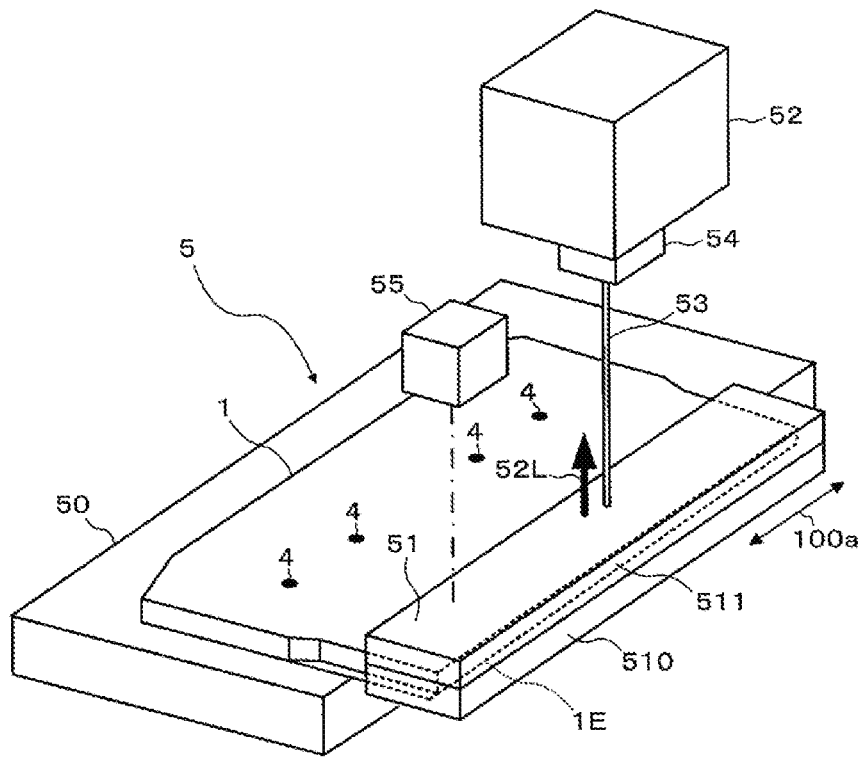

[FIG. 6]
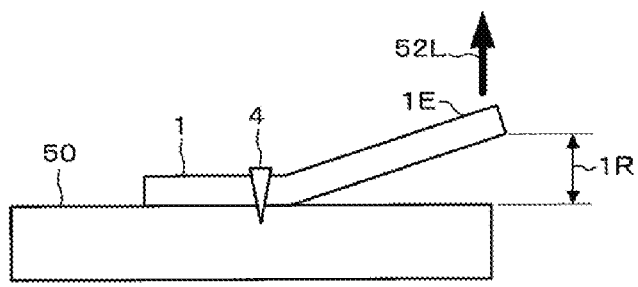

[FIG. 7]
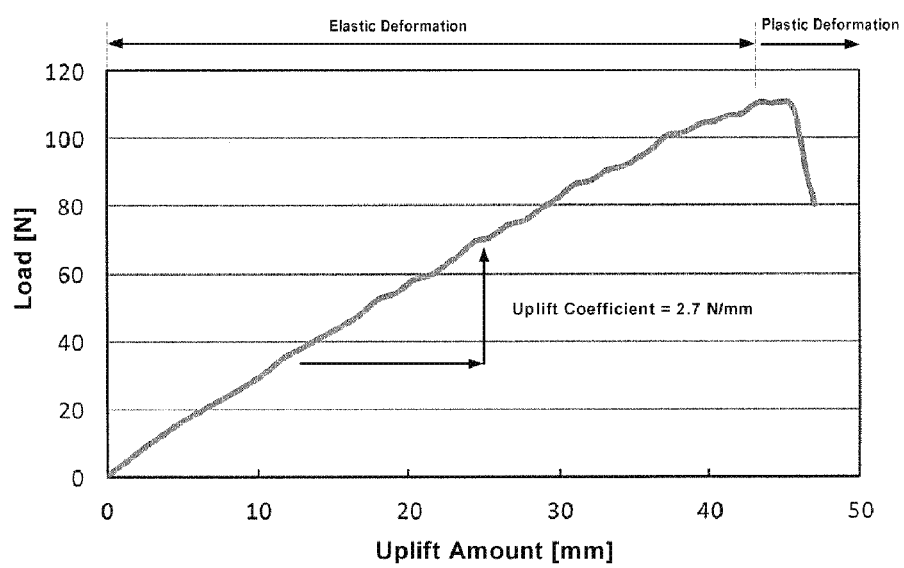

[FIG. 8]
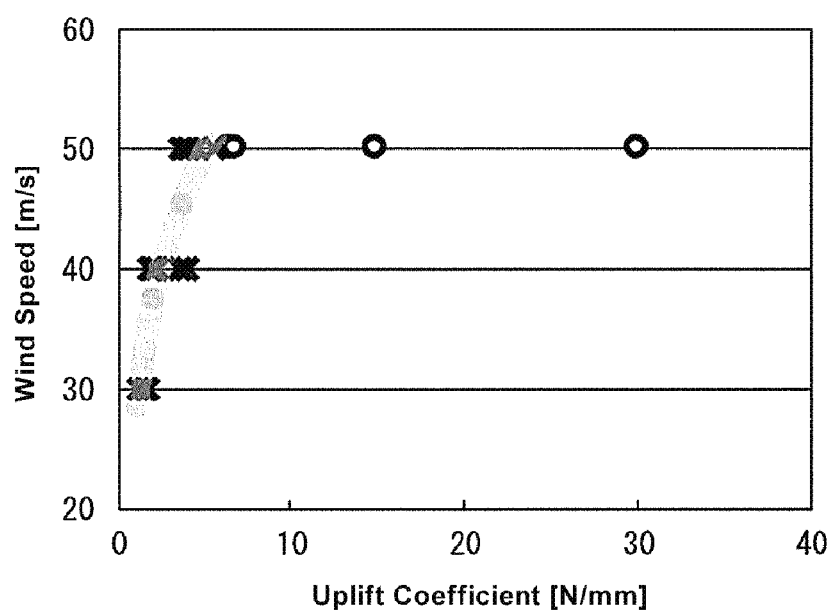

[FIG. 9]
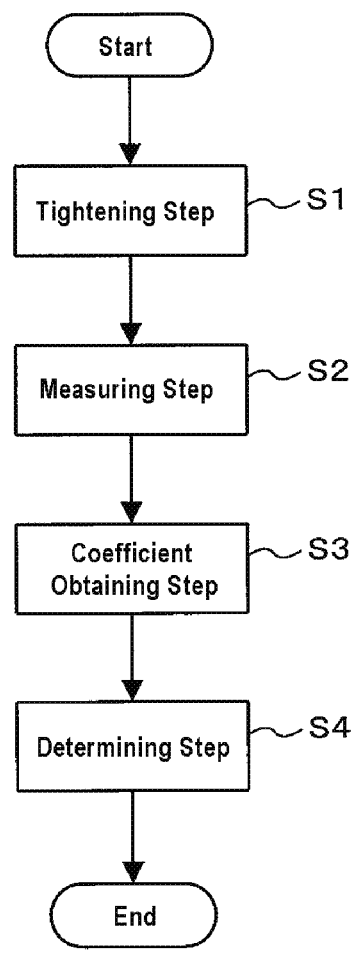

[FIG. 10]
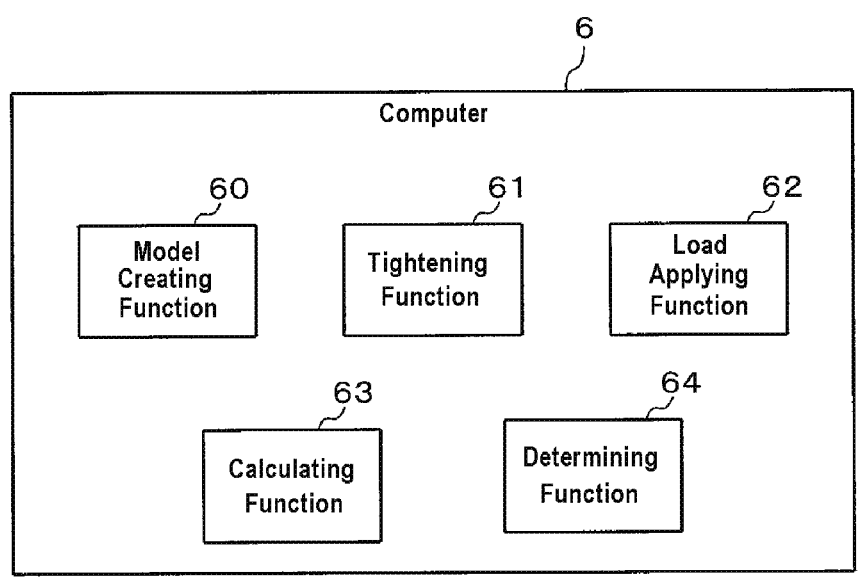

STRENGTH TEST METHOD FOR METAL ROOFING MATERIAL, STRENGTH TEST EQUIPMENT, AND VIRTUAL STRENGTH TEST PROGRAM

The present application is a U.S. National Stage of PCT International Patent Application No. PCT/JP2017/008785, filed Mar. 6, 2017, which claims priority to JP Application No. 2016-050805, filed Mar. 15, 2016, both of which are hereby incorporated herein by reference

TECHNICAL FIELD

The present invention relates to a strength test method for a metal roofing material, strength test equipment and a virtual strength test program, for testing the metal roofing material.

BACKGROUND ART

For example, a roofing material for forming roofs of buildings such as houses can include a ceramic roofing material as disclosed in Patent Document 1 and the like described below. Strength of such a ceramic roofing material is tested by a method defined in the Japanese Industrial Standard A 1408. That is, the strength test of the ceramic roofing material is carried out by cutting out a test piece having predetermined dimensions from the ceramic roofing material, and then placing the test piece on a pair of supports arranged at a predetermined interval and applying a load to the test piece from an upper part of a central position of the support, and measuring the load when the test piece is broken.

On the other hand, the above ceramic roofing material has a problem that it is relatively heavy, for example. Therefore, the present inventors have attempted implementation of a metal roofing material as disclosed in the following Patent Document 2, i.e., a metal roofing material including a metal front substrate; a back substrate disposed on the back side of the front substrate; and a core material filled between the front substrate and the back substrate.

CITATION LIST

Patent Literatures

Patent Document 1: Japanese Patent Application Publication No. 2011-226231 A
Patent Document 2: Japanese Patent No. 5864015 B

SUMMARY OF INVENTION

Technical Problem

The strength of the metal roofing material as described above is ensured by the entire structure of the metal roofing material. For this reason, even if the strength test is carried out using a test piece cut out from the metal roofing material as in the method defined in the Japanese Industrial Standard A 1408, the strength of the metal roofing material cannot be correctly evaluated.

It is also considered that a presence or absence of breakage is observed by installing the roofing material on a test stand having a roof slope, which simulates a roof, and conducting a simulation test of the typhoon using a blower that can provide turbulent wind. However, such a test using the blower is a relatively large-scale test, and requires time and expense.

The present invention has been made to solve the above problems. An object of the present invention is to provide a method for testing a strength of a metal roofing material, a strength test equipment and a virtual strength test program, which can more accurately and easily evaluate the strength of the metal roofing material.

Solution to Problem

The present invention relates to a method for testing strength of a metal roofing material, the metal roofing material comprising: a front substrate made of a metal sheet; a back substrate arranged on the back side of the front substrate; and a core material filled between the front substrate and the back substrate, the method comprising the steps of: tightening the metal roofing material to a base; and applying a load for uplifting an end portion of the metal roofing material tightened to the base to the end portion and measuring an uplift amount of the end portion.

The present invention also relates to strength test equipment for performing the method for testing the metal roofing material, the strength test equipment comprising: a base to which the metal roofing material is tightened; a frame body attached to an end portion of the metal roofing material; a load applying device for applying a load for uplifting the end portion of the metal roofing material to the end portion, the load applying device being connected to the end portion via the frame body; a load meter for measuring the load applied to the end portion from the load applying device, the load meter being interposed between the frame body and the load applying device; and a displacement meter for measuring an uplift amount of the end portion when the load is applied from the load applying device to the end portion.

The present invention also relates to a virtual strength test program of a metal roofing material, for causing a computer to realize functions of virtually testing strength of a metal roofing material, the roofing material comprising: a front substrate made of a metal sheet; a back substrate arranged on the back side of the front substrate; and a core material filled between the front substrate and the back substrate, the virtual strength test program being configured to cause the computer to realize: a model creating function of receiving an input of property information indicating mechanical properties and material physical properties of the front substrate, the back substrate and the core material, and creating a model of the metal roofing material based on the property information; a tightening function of receiving tightening information indicating at least one position where the model is tightened, and tightening the model to the base in a virtual space based on the tightening information; a load applying function of applying a load for uplifting an end portion of the model to the end portion of the model tightened to the base in the virtual space; and a calculating function of calculating an uplift amount of the end portion when the load is applied to the end portion.

Advantageous Effects of Invention

According to the strength test method for the metal roofing material, the strength test equipment and the virtual strength test program according to the present invention, the load for uplifting the end portion of the metal roofing material tightened to the base is applied to the end portion and the uplift amount of the end portion, which corresponds to the load, is obtained, so that the strength of the entire metal roofing material can be confirmed by a relatively small scale test, and the strength of the metal roofing material can be more accurately and easily evaluated.

BRIEF DESCRIPTION OF DRAWINGS

FIG. 1 is a front view showing a metal roofing material subjected to a method for testing strength of a metal roofing material according to Embodiment 1 of the present invention.

FIG. 2 is a back view showing the metal roofing material 1 in FIG. 1.

FIG. 3 is a cross-sectional view of the metal roofing material taken along the line III-III in FIG. 1.

FIG. 4 is an explanatory view showing a roofing structure using the metal roofing materials in FIG. 1.

FIG. 5 is a perspective view showing strength test equipment for carrying out a strength test of the metal roofing material in FIG. 1.

FIG. 6 is an explanatory view showing an uplifted state of an end portion of the metal roofing material in FIG. 5.

FIG. 7 is a graph showing an example of an uplift amount of the end portion versus a load measured by the strength test equipment in FIG. 5.

FIG. 8 is a graph showing a relationship between the uplift coefficient in FIG. 7 and a wind speed of wind blowing on a metal roofing material.

FIG. 9 is a flow chart showing a method for testing strength of a metal roofing material according to Embodiment 1 of the present invention.

FIG. 10 is an explanatory view showing a computer for performing a virtual strength test of a metal roofing material according to Embodiment 2 of the present invention.

DESCRIPTION OF THE PREFERRED EMBODIMENTS

Embodiments for carrying out the present invention will be described with reference to the drawings.

Embodiment 1

FIG. 1 is a front view showing a metal roofing material subjected to a method for testing strength of a metal roofing material according to Embodiment 1 of the present invention, FIG. 2 is a back view showing the metal roofing material 1 in FIG. 1, FIG. 3 is a cross-sectional view of the metal roofing material 1 taken along the line III-III in FIG. 1, and FIG. 4 is an explanatory view showing a roofing structure using metal roofing materials 1.

The metal roofing material 1 shown in FIGS. 1 to 3 is arranged together with other metal roofing materials on a roof base in a roof of a building such as a house, as shown in FIG. 4. As can be particularly seen from FIG. 3, the metal roofing material 1 includes a front substrate 10, a back substrate 11 and a core material 12.

The front substrate 10 is a metal member that is made of a metal sheet and that appears on the outer surface of the roof as the metal roofing material 1 is placed on the roof base. A steel sheet, an Al sheet or Ti sheet and surface treated sheets thereof can be used as the metal sheet making up the front substrate 10. The surface treated sheets include coated sheets and plated sheets.

The front substrate 10 is provided with a box-shaped body portion 100 having a top plate portion 101 and a peripheral wall portion 102. The body portion 100 can be formed by subjecting the metal sheet to a drawing process or a bulging process such that the peripheral wall portion 102 forms a continuous wall surface in the circumferential direction of the front substrate 10. The top plate portion 101 is provided with a plurality of driving indicators 101a arranged to be separated from each other in a width direction 100a (longitudinal direction) of the body portion 100. Each driving indicator 101a is for indicating a position where a tightening member such as a screw or a nail is driven into the body portion 100 when tightening the metal roofing material 1 to the roof base. Each driving indicator 101a can be formed by a concave portion, a convex portion, an opening, a printed or engraved symbol, or the like.

The back substrate 11 is arranged on the back side of the front substrate 10 so as to covert an opening of the body portion 100. Lightweight materials such as aluminum foil, aluminum vapor deposited paper, aluminum hydroxide paper, calcium carbonate paper, resin films or glass fiber paper and the like can be used as the back substrate 11. The same materials as those for the front substrate 10 may also be used for the back substrate 11, as needed.

The core material 12 is made of, for example a foamed resin or the like, and is filled between the body portion 100 of the front substrate 10 and the back substrate 3. Examples of the materials of the core material 12 includes, but not limited to, urethane, phenol and cyanurate resins.

As shown in FIG. 4, each metal roofing material 1 is adapted such that a width direction 100a (longitudinal direction) of the body portion 100 extends along an eave direction 2 parallel to an eave of the roof and a depth direction 100b (short direction) extends along an eave-ridge direction 3 of the roof. Each metal roofing material 1 is tightened to the roof base by driving the fastening members 4 into the body portion 100 at the driving indicators 101a. Further, in the eave-ridge direction 3, the metal roofing material 1 on the ridge side is placed on the roof base while being overlaid onto the metal roofing material 1 on the eave side. It should be noted that the fastening members 4 do not necessarily need to be driven into the driving indicators 101a, and may be driven into any positions.

Next, FIG. 5 is a perspective view showing strength test equipment 5 for performing the strength test for the metal roofing material 1 in FIG. 1, and FIG. 6 is an explanatory view showing an uplifted state of an end portion 1E of the metal roofing material 1 in FIG. 5. As shown in FIG. 5, the strength test equipment 5 includes a base 50, a frame body 51, a load applying device 52, a connection member 53, a load meter 54, and a displacement meter 55.

The base 50 is a member onto which the metal roofing material 1 subjected to the strength test is placed and tightened. The base 50 simulates an actual roof base to which the metal roofing material 1 is tightened, and can be formed from, for example, a wooden plate or the like. The tightening of the metal roofing material 1 to the base 50 is preferably carried out in accordance with the actual tightening of the metal roofing material 1 to the roof base. That is, the metal roofing material 1 is preferably tightened to the base 50 by driving the tightening members 4 into the body portion 100 of the metal roofing material 1 at predetermined positions, in accordance with the method of actually tightening the metal roofing material 1 to the roof base, as shown in FIG. 4.

The frame body 51 is a member attached to the end portion 1E of the metal roofing material 1. The frame body 51 includes a longitudinal base body 510 and a cover body 511 that extend in the width direction 100a. Although not shown, at least one of the base body 510 and the cover body 511 is provided with a concave portion compatible with the outer shape of the end portion 1E of the metal roofing material 1, and the base body 510 and the cover body 511 are connected to each other while fitting the end portion 1E into the concave portion. That is, the end portion 1E of the metal roofing material 1 is sandwiched between the base body 510 and the cover body 511, whereby the frame body 51 is attached to the end portion 1E of the metal roofing material 1.

The extending width of the frame body 51 in the width direction 100a is wider than the extending width of the end portion 1E of the metal roofing material 1 in the width direction 100a, and the frame body 51 is integrated with the entire end portion 1E of the metal roofing material 1 in the width direction 100a. Thus, when a load is applied to the end portion 1E of the metal roofing material 1 through the frame body 51, the load is equally applied to the entire end portion 1E of the metal roofing material 1. It should be noted that the end portion 1E of the metal roofing material 1 to which the frame body 51 is attached is the eave side end portion located on the eave side of the roof when the metal roofing material 1 is placed on the roof base, as shown in FIG. 4.

The load applying device 52 is connected to the end portion 1E of the metal roofing material 1 through the frame body 51, and applies a load 52L for uplifting the end portion 1E of the metal roofing material 1 to the end portion 1E. The load applying device 52 that can be used includes, for example, actuators such as press machines. In the strength test equipment 5 according to the embodiment, the load applying device 52 is placed above the frame body 51, connected to the frame body 51 via the connection member 53 such as a wire, and configured to pull up the end portion 1E via the connection member 53 and the frame body 51. However, the load applying device 52 may be placed below the frame body 51 and configured to push up the end portion 1E via the frame body 51.

The load meter 54 is a sensor which is interposed between the frame body 51 and the load applying device 52 and which measures the load 52L applied from the load applying device 52 to the end portion 1E of the metal roofing material 1. In the embodiment, the load meter 54 is fixed to the lower portion of the load applying device 52. The connection member 53 is connected to the load meter 54.

The displacement meter 55 is a sensor for measuring an uplift amount 1R of the end portion 1E when the load 52L is applied from the load applying device 52 to the end portion 1E of the metal roofing material 1. In the embodiment, the displacement meter 55 is constituted by a laser displacement meter supported by a support (not shown) so as to be positioned above the frame body 51. However, as the displacement meter 55, any other sensor may be used, such as, for example, a sensor which is arranged in contact with the frame body 51 or the end portion 1E and mechanically measures the uplift amount of the end portion 1E.

Here, when the wind blows against the metal roofing material 1 tightened to the roof base, the wind causes the load for uplifting the end portion 1E of the metal roofing material 1 to be applied to the metal roofing material 1. The load 52L of the load applying device 52 simulates such a load of wind.

When the end portion 1E of the metal roofing material 1 is uplifted by a certain amount due to excessive strong wind, the wind enters a gap between the end portion 1E of the metal roofing material 1 and the roof base. The wind thus entering the gap will act on a wide region of the back surface of the metal roofing material 1 and rapidly break the metal roofing material 1. That is, the strength of the metal roofing material 1 significantly correlates with difficulty in uplifting the end portion 1E of the metal roofing material 1. By measuring the load 52L and the uplift amount 1R with the load meter 54 and the displacement meter 55, the difficulty in uplifting the end portion 1E of the metal roofing material 1, that is, the strength of the metal roofing material 1, can be evaluated.

Next, FIG. 7 is a graph showing an example of the uplift amount 1R of the end portion 1E versus the load 52L measured by the strength test equipment 5 in FIG. 5. When the load 52L for uplifting the end portion 1E of the metal roofing material 1 is applied to said end portion 1E, the metal roofing material 1 undergoes elastic deformation until the load 52L reaches a predetermined value. As shown in FIG. 7, while the metal roofing material 1 undergoes elastic deformation, the uplift amount 1R substantially linearly increases with an increase in the load 52L.

The inclination of the linearly increasing region of the uplift amount 1R, that is, an amount of change in the load 52L relative to an amount of change in the measured uplift amount 1R is an index representing the difficulty in uplifting the end portion 1E of the metal roofing material 1. Hereinafter, the amount of change in the load 52L relative to the amount of change in the uplift amount 1R is referred to as an uplift coefficient [N/mm]. By determining such an uplift coefficient, the strength of the metal roofing material 1 can be more reliably evaluated. In the example of FIG. 7, the uplift coefficient is 2.7 [N/mm].

Next, FIG. 8 is a graph showing a relationship between the uplift coefficient in FIG. 7 and a wind speed of the wind blowing on the metal roofing material 1. The present inventors experimentally produced various metal roofing materials, conducted a blowing test using them as samples to be tested and investigated the relationship between the uplift coefficient and the wind speed at breakage.

In the blowing test, 15 samples (metal roofing materials 1) each having a width of 908 mm×a depth of 414 mm were placed upon a base material having a width of 2000 mm×a depth of 1184 mm arranged with a gradient of about 26.6° to construct a simulated roof. The samples were arranged on the simulated roof as shown in FIG. 4. More particularly, two or three samples were arranged in the eave direction 2 to form a sample row, and the sample row is stacked in the eave direction 3 to arrange six sample rows. In the eave-ridge direction 3, the sample on the ridge side was overlapped on the sample on the eave side such that 154 mm of the sample on the eave side protrudes from the sample on the ridge side. In the eave direction 2, a protruding portion of the sample from the base material was cut out. Then, a blower nozzle was installed in front of the simulated roof, and wind was blown from the blowing nozzle against the simulated roof. The blower nozzle was placed at a position of 1 m ahead the center of the simulated roof and the height at the center of the blower nozzle was allowed to coincide with the height at the center of the simulated roof. The wind speed at breakage refers to a wind speed at which the metal roofing material 1 is broken when the wind is blown from the air blowing nozzle against the metal roofing material 1. In FIG. 8, breakage of the metal roofing material 1 is represented by "x" and non-breakage of the metal roofing material 1 is represented by "○".

As shown in FIG. 8, the metal roofing material 1 having an uplift coefficient of less than 6 N/mm could not withstand a wind of 50 m/s or less, so that it was broken. However, the metal roofing material 1 having an uplift coefficient of 6 N/mm or more was not broken even if a wind of 50 m/s was brown. Therefore, it was found that whether or not the metal roofing material 1 can withstand the wind of 50 m/s can be determined by determining whether or not the uplift coefficient of the metal roofing material 1 is 6 N/mm or more.

Next, FIG. 9 is a flow chart showing a method for testing strength of the metal roofing material 1 according to Embodiment 1 of the present invention. In the figure, when performing the strength test of the metal roofing material 1, the metal roofing material 1 to be tested is first tightened to the base 50 (tightening step: step S1). As described above, the tightening of the metal roofing material 1 to the base 50 is preferably performed in accordance with the actual tightening of the metal roofing material 1 to the roof base.

The load 52L for uplifting the end portion 1E of the metal roofing material 1 tightened to the base 50 is then applied to the end portion 1E, and the uplift amount 1R of the end portion 1E corresponding to the load 52L is measured (measuring step: step S2). The load applying device 52 in FIG. 5 can be used for applying the load 52L to the end portion 1E. Further, the load meter 54 and displacement meter 55 in FIG. 5 can be used for measuring the load 52L and the uplift amount 1R.

The uplift coefficient represented by an amount of change in the load 52L relative to an amount of change in the uplift amount 1R measured in the measuring step is then obtained (coefficient obtaining step: step S3), and whether or not the uplift coefficient is 6 N/mm or more is determined (determining step: step S4). In this case, if the uplift coefficient is determined to be 6 N/mm or more, an operator can determine that the metal roofing material 1 can withstand a wind of 50 m/s. It should be noted that when selecting the metal roofing material 1 that can withstand a lower wind speed, a lower uplift coefficient can be used for determination.

In such a strength test method and strength test equipment for the metal roofing material 1, the load 52L for uplifting the end portion 1E of the metal roofing material 1 tightened to the base 50 is applied to the end portion 1E to obtain the uplift amount 1R of the end portion 1E corresponding to the load 52L, so that the strength of the entire metal roofing material 1 can be confirmed by a relatively small scale test and the strength of the metal roofing material 1 can be more correctly and conveniently evaluated.

Further, the uplift coefficient represented by the amount of change in the load 52L relative to the amount of change in the measured uplift amount 1R is obtained, so that the strength of the metal roofing material 1 can be more easily evaluated.

Furthermore, whether or not the uplift coefficient is 6 N/mm or more is determined, so that whether or not the metal roofing material 1 can withstand the wind of 50 m/s can be more easily evaluated.

Embodiment 2

FIG. 10 is an explanatory view showing a computer for performing a virtual strength test of the metal roofing material according to Embodiment 2 of the present invention. In the embodiment 1, the test for measuring the load 52L and the uplift amount 1R when the load 52L is actually applied to the metal roofing material 1 has been described, but this test may be virtually performed by a computer 6.

The computer 6 shown in FIG. 10 includes a storage means and an arithmetic means, and operates in accordance with a virtual strength test program for the metal roofing material stored in the storage means or a readable medium, thereby realize a model creating function 60, a tightening function 61, a load applying function 62, a calculating function 63, and a determining function 64.

The model creating function 60 is a function of receives an input of property information indicating mechanical properties and material physical properties of the front substrate 10, the back substrate 11 and the core material 12 of the metal roofing material 1 to be virtually tested, and creating a model of the metal roofing material 1 based on the property information. The mechanical properties include dimensions of each portion of the front substrate 10, the back substrate 11 and the core material 12. The material physical properties include Young's modulus, Poisson's ratio and density of each portion.

The tightening function 61 is a function of receiving tightening information indicating positions where the model is tightened, and tightening the model to the base in a virtual space based on the tightening information. The state where the model is tightened to the base in the virtual space corresponds to the state where the metal roofing material 1 is tightened to the base 50 in FIG. 5. The positions where the model is tightened are preferably in accordance with the actual tightening of the metal roofing material 1 to the roof base as with the embodiment 1. The tightening of the model is provided by constraining the tightening positions of the model.

The load applying function 62 is a function of applying a load for uplifting the end portion of the model to the end portion of the model tightened to the base in the virtual space. The end portion to which the load is applied is an end portion of the model corresponding to the eave side end portion located on the eave side of the roof when the metal roofing material 1 is placed on the roof base, as shown in FIG. 4. The applying of the load to the end portion may be performed by pulling up the end portion or by pushing up the end portion.

The calculating function 63 is a function of calculating the uplift amount of the end portion when the load is applied to the end portion. For the calculation, a finite element method is used. For the calculation, a calculating function of a generic nonlinear analysis software Marc or the like can be used, for example.

Further, the calculating function 63 calculates the uplift coefficient represented by the amount of change in the load relative to the amount of change in the calculated uplift amount. The load used for calculating the uplift coefficient is obtained from the load applying function 62.

The determining function 64 is a function of determining whether or not the uplift coefficient calculated by the calculating function 63 is equal to or more than a predetermined value. The predetermined value used for the determination can be changed based on input information from the outside. As the predetermined value, 6 N/mm can be used when evaluating whether or not the metal roofing material 1 can withstand a wind of 50 m/s. Other configurations are the same as those in the embodiment 1.

In such a virtual strength test program for the metal roofing material, the load for uplifting the end portion of the model of the metal roofing material 1 tightened to the base is applied to the end portion in the virtual space, and the uplift amount of the end portion corresponding to the load is obtained, so that the strength of the metal roofing material 1 can be more easily evaluated.

What is claimed is:

1. A method for testing strength of a metal roofing material, the metal roofing material comprising: a front substrate made of a metal sheet, a back substrate arranged on a back side of the front substrate, and a core material filled between the front substrate and the back substrate, the method comprising the steps of:

tightening the metal roofing material to a base with the back substrate facing the base; and applying a load for uplifting an end of the metal roofing material tightened to the base to the end, the end defined by edges of the front substrate and the back substrates that are attached to each other, and measuring an uplift amount of the end, wherein a frame body to be integrated with the entire end in a width direction of the metal roofing material is attached to the end, an extending width of the end of the frame body in the width direction being wider than an extending width of the end of the metal roofing material in the width direction, and then the load is applied to the end through the frame body.

2. The method for testing strength of the metal roofing material according to claim 1, further comprising a step of obtaining an uplift coefficient represented by an amount of change in the load relative to an amount of change in the measured uplift amount.

3. The method for testing strength of the metal roofing material according to claim 2, further comprising a step of determining whether or not the uplift coefficient is 6 N/mm or more.

4. Strength test equipment for performing a method for testing a metal roofing material having a front substrate and a back substrate arranged on a back side of the front substrate, the strength test equipment comprising:

a base to which the metal roofing material is tightened with the back substrate facing the base;

a frame body attached to an end of the metal roofing material, the end defined by edges of the front substrate and the back substrate that are attached to each other, an extending width of the end of the frame body in the width direction being wider than an extending width of the end of the metal roofing material in the width direction, and integrated with the entire end in a width direction of the metal roofing material;

a load applying device for applying a load for uplifting the end of the metal roofing material to the end through the frame body, the load applying device being connected to the end via the frame body;

a load meter for measuring the load applied to the end from the load applying device, the load meter being interposed between the frame body and the load applying device; and a displacement meter for measuring an uplift amount of the end when the load is applied from the load applying device to the end.

\* \* \* \* \*